United States Patent
Peng

(12) 
(10) Patent No.: US 6,467,427 B1
(45) Date of Patent: Oct. 22, 2002

(54) EVAPORATION SOURCE MATERIAL SUPPLIER

(75) Inventor: Kuang-Chung Peng, Taipei (TW)

(73) Assignee: Helix Technology Inc., Hsinchu (TW)

( * ) Notice: Subject to any disclaimer, the term of this patent is extended or adjusted under 35 U.S.C. 154(b) by 118 days.

(21) Appl. No.: 09/710,713

(22) Filed: Nov. 10, 2000

(51) Int. Cl.[7] .................. H01L 21/285; C23C 16/00
(52) U.S. Cl. .................. 118/723 VE; 118/726; 118/727
(58) Field of Search .................. 118/723 VE, 727, 118/715, 726, 723 EB; 219/121.15; 373/10–17, 115; 414/935–941

(56) References Cited

U.S. PATENT DOCUMENTS 6,340,501 B1 * 1/2002 Kamiyama .................. 118/715

FOREIGN PATENT DOCUMENTS

| JP | 63-58622 | * | 3/1988 | .......... C23C/14/24 |
|---|---|---|---|---|
| JP | 01-108364 | * | 4/1989 | .......... C23C/14/24 |
| JP | 02-118071 | * | 5/1990 | .................. 118/724 |
| JP | 03-126823 | * | 5/1991 | .................. 118/724 |
| JP | 07-098865 | * | 11/1995 | .......... C23C/14/24 |
| WO | WO98/50916 | * | 12/1998 | .................. 118/715 |

* cited by examiner

Primary Examiner—Gregory Mills
Assistant Examiner—Ram N Kackar
(74) Attorney, Agent, or Firm—J.C. Patents

(57) ABSTRACT

A supplier of evaporation source material. The evaporation system that uses the source material supplier includes an evaporation chamber and a vacuum extraction system. The vacuum extraction system is connected to the evaporation chamber. The source material supplier, a movable evaporation boat and a wafer holder are housed inside the evaporation chamber. The source material supplier is on one of the sidewalls inside the evaporation chamber. The wafer holder is in the upper portion of the evaporation chamber. The wafer holder is responsible for holding a wafer requiring thin film deposition. The movable evaporation boat is in the lower portion of the evaporation chamber for holding evaporation source material. The source material supplier includes a revolving cassette wheel and a crucible under the cassette wheel. The revolving cassette wheel is partition by separating plates and an outer casing into a plurality of capsules with each capsule capable of holding a fixed amount of evaporation source material. When the cassette wheel rotates, the lowest capsule can deliver a lump of evaporation source material onto the crucible via a drop hole in the outer casing.

16 Claims, 2 Drawing Sheets

EVAPORATION SOURCE MATERIAL SUPPLIER

BACKGROUND OF THE INVENTION

1. Field of Invention

The present invention relates to an evaporation system. More particularly, the present invention relates to a supplier of evaporation source material.

2. Description of Related Art

Thin film deposition technique includes physical vapor deposition and chemical vapor deposition. Physical vapor deposition includes evaporation deposition. Evaporation deposition is carried out by heating an evaporation source to vaporize the source material. The vaporized material forms a saturated vapor that can be deposited back onto a cooler surface as a thin film. Most evaporation system includes an evaporation chamber and a vacuum system for creating a vacuum inside the evaporation chamber. The evaporation chamber also contains an evaporation boat and a wafer holder. The evaporation boat is a container for holding evaporation material normally positioned at the lower end of the evaporation chamber. The evaporation boat can be made from a substance having a high melting point. There is a wafer holder near the top end of the evaporation chamber. The wafer holder is a device for holding a wafer or a substrate that requires thin film deposition. When a suitable current runs through the evaporation boat, the evaporation boat is heated up due to resistor effect. The source material will be heated to a temperature close to its melting point. At such a high temperature, the source material starts to evaporate and saturate the evaporation chamber. The evaporated source particles are deposited onto the cooler wafer surface, thus initiating the thin film deposition process.

FIG. 1 is schematic front view of a conventional evaporation system. As shown in FIG. 1, the evaporation system 100 includes an evaporation chamber 102 and a vacuum extraction system 104. The vacuum extraction system 104 is connected to the evaporation chamber 102. The components inside the evaporation chamber 102 include an evaporation boat 106 and a wafer holder 108. The evaporation boat 106 is in the lower portion of the evaporation chamber 102 for holding an evaporation source 110. The wafer holder 108 is in the upper portion of the evaporation chamber 102. The wafer holder 108 is a device for holding a wafer 112 requiring thin film deposition. When a suitable current runs through the evaporation boat 106, the evaporation boat 106 and the source material 110 are heated up to a temperature close to the melting point of the source material 110. At such a high temperature, the solid source material 110 evaporates into vapor that can be deposited back onto the wafer 112 lying above the evaporation source 110. However, a conventional evaporation system may run out of evaporation source material in a continuous evaporation process and need replenishing. Time is often wasted in replenishing the evaporation boat 106 because the vacuum inside the evaporation chamber needs to be retreated and then re-established after each replenishing. Thus, source material replenishing not only slows thin film deposition, but also increases operating load of the vacuum extraction system 104.

SUMMARY OF THE INVENTION

Accordingly, one object of the present invention is to provide a system capable of providing sufficient evaporation source material to last the entire course of a thin film deposition or a long-period continuous deposition. Hence, time-out due to insufficient source material can be prevented and a higher overall productivity can be achieved.

To achieve these and other advantages and in accordance with the purpose of the invention, as embodied and broadly described herein, the invention provides a supplier of evaporation source material. The evaporation system that uses the source material supplier includes an evaporation chamber and a vacuum extraction system. The vacuum extraction system is connected to the evaporation chamber. The source material supplier, a movable evaporation boat and a wafer holder are housed inside the evaporation chamber. The source material supplier is on one of the sidewalls of the evaporation chamber. The wafer holder is in the upper portion of the evaporation chamber. The wafer holder is responsible for holding a wafer requiring thin film deposition. The movable evaporation boat is in the lower portion of the evaporation chamber for holding evaporation source material. The source material supplier includes a revolving cassette wheel and a crucible under the cassette wheel. The revolving cassette wheel is partition by separating plates and an outer casing into a plurality of capsules with each capsule capable of holding a fixed amount of evaporation source material. When the cassette wheel rotates, the lowest capsule can deliver a lump of evaporation source material onto the crucible via a drop hole in the outer casing.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
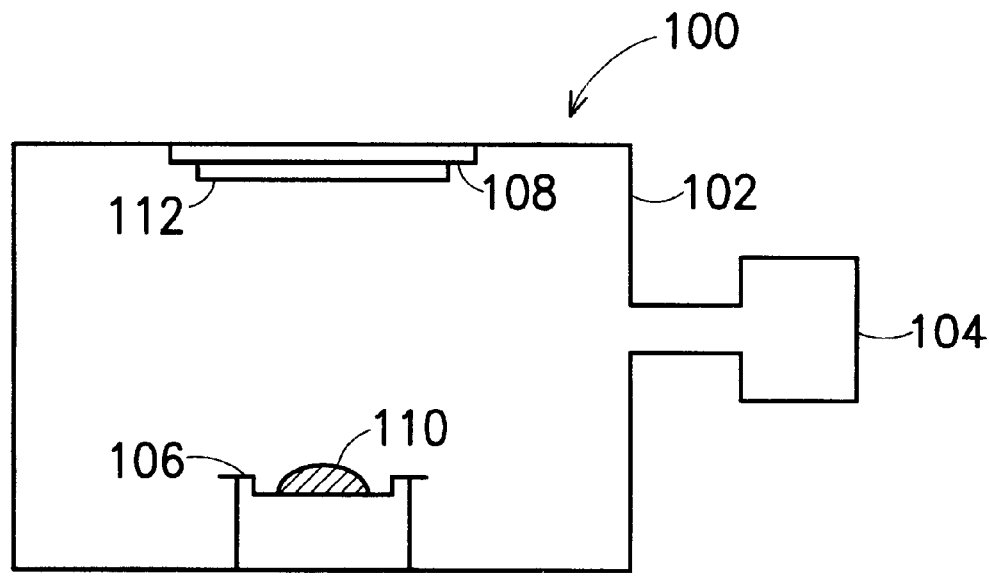
FIG. 1 is schematic front view of a conventional evaporation system.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
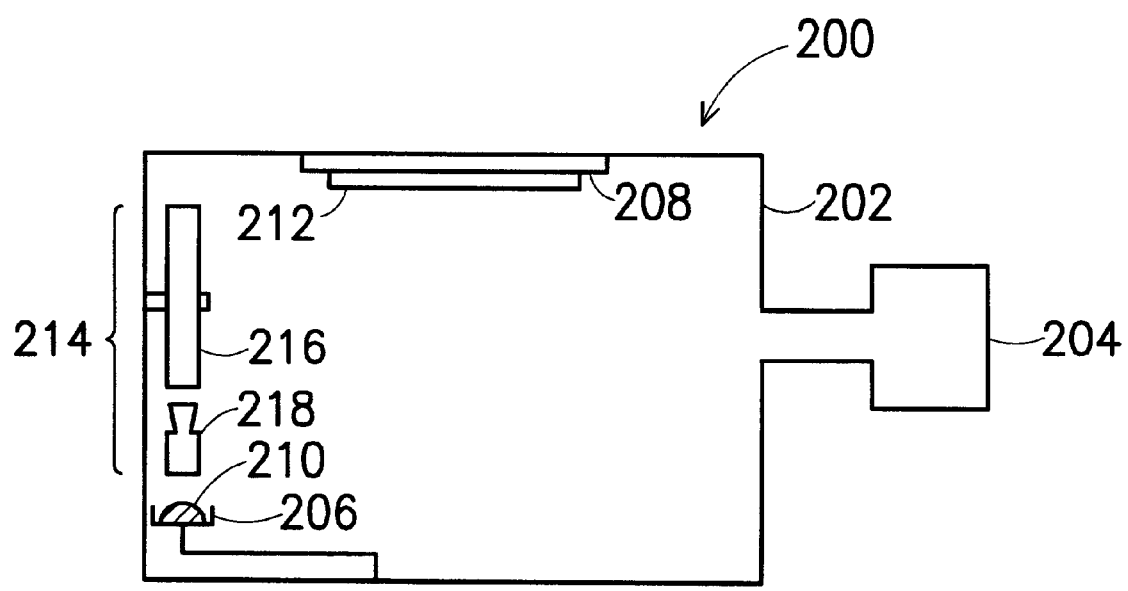
FIG. 2A is a schematic front view of an evaporation system according to one preferred embodiment of this invention.

FIG. 2A is a schematic front view of an evaporation system according to one preferred embodiment of this invention.

As shown in FIG. 2A, the evaporation system 200 includes an evaporation chamber 202 and a vacuum extraction system 204. The vacuum extraction system 204 is connected to the evaporation chamber 202. Inside the evaporation chamber 202 is a movable evaporation boat 206, a wafer holder 208 and a source material supplier 214. The movable evaporation oat 206 is in the lower portion of the evaporation chamber 202 for holding evaporation source material 210. The wafer holder 208 is in the upper portion of the evaporation chamber 202. The wafer holder 208 fastens a wafer that needs thin film deposition. The source material supplier 214 is mounted on one of the sidewalls of the evaporation chamber 202. The source material supplier 214 includes a revolving cassette wheel 216 and a crucible 218 underneath the wheel 216. The source material supplier 214 is a timed material supplier. In other words, the cassette wheel 216 will turn an angle after a preset period so that a lump of the evaporation material 210 will drop into the crucible 218. The crucible 218 may be connected to a direct current source and heated. As the evaporation is heated to a temperature close to the movable evaporation boat 206, the material inside the crucible 218 is transferred to the boat 206. When a suitable current is applied to a resistor inside the evaporation boat 206, the cargo of evaporation source 210 inside the boat 206 is heated to a temperature close to the melting point. At such a high temperature, the evaporation source 210 evaporates strongly into vapor. The evaporated source particles are deposited back onto the cooler surface of the wafer 212 to form a thin film.

Figure 2B:
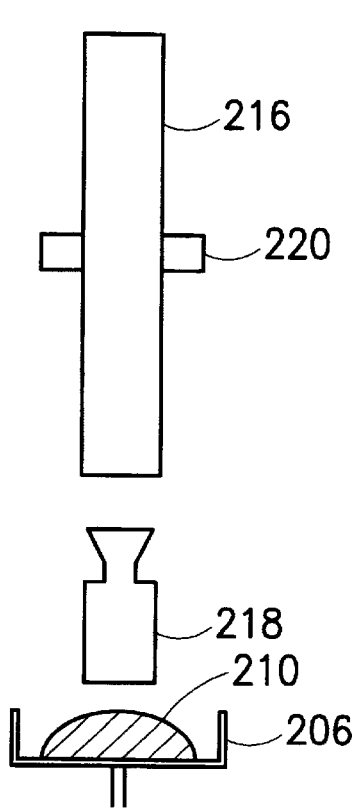
FIG. 2B is a side view of the source material supplier of the evaporation system shown in FIG. 2A.
Figure 2C:
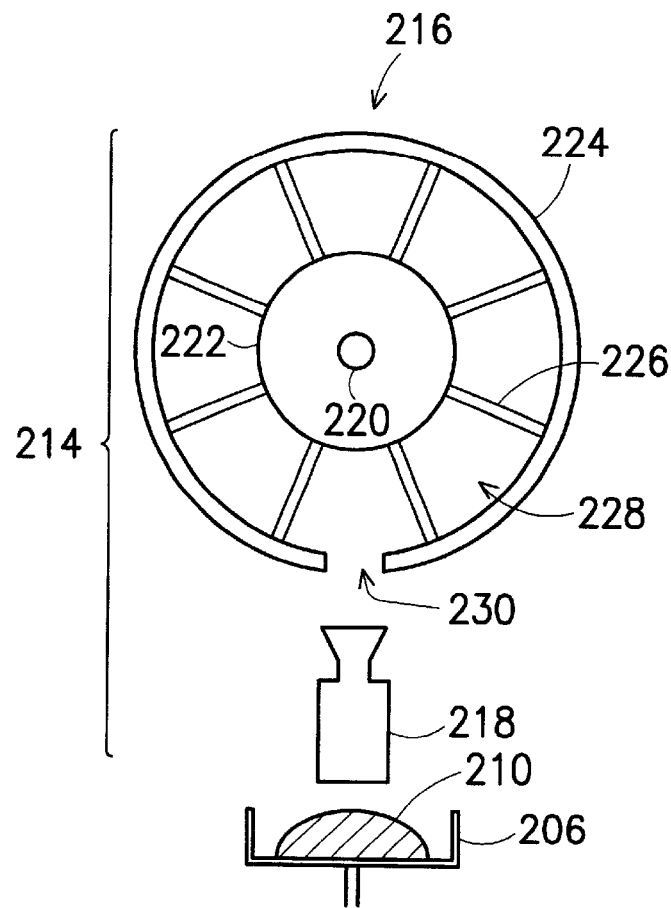
FIG. 2C is a front view of the source material supplier of the evaporation system shown in FIG. 2A.

FIG. 2B is a side view of the source material supplier of the evaporation system shown in FIG. 2A. FIG. 2C is a front view of the source material supplier of the evaporation system shown in FIG. 2A.

As shown in FIGS. 2B and 2C, the source material supplier 214 comprises of a revolving cassette wheel 216 and a crucible underneath the wheel 216. The revolving cassette wheel structure mainly includes a central axle 220, a revolving wheel 222 and a fixed outer casing 224. The central axle 220 permits rotation of the revolving wheel 222. A plurality of separating plates 226 is distributed evenly around the perimeter of the revolving wheel 222. These separating plates 226 partition the wheel into a plurality of small capsules 228 each capable of holding a lump of evaporation source material 210. The entire revolving wheel 222 is enclosed by the fixed outer casing 224. The fixed outer casing 224 has a drop hole 230 directly above the crucible 218. When the cassette wheel 216 rotates, a capsule 228 closest to the crucible 218 will drop its cargo of evaporation source material 210 into the crucible 218 via the drop hole 230. After the crucible 218 is heated to a high temperature, the evaporation source material 210 inside the crucible 218 is transferred to the movable evaporation boat 206, thus replenishing the boat 206. The amount of evaporation material inside each capsule 228 must be predetermined so that the rotating cycle of the revolving wheel 216 can be estimated. The angle of turn for delivering a lump of evaporation source material depends on the number of capsules 228 in the wheel 216.

Since this invention can provide a continuous supply of evaporation source material, the evaporation chamber can perform vapor deposition in a high vacuum state for long period.

In addition, the revolving cassette wheel design can provide a fixed quantity of evaporation source material at a fixed interval of time. Since the evaporating system never has to stop for reloading source material, workload of the vacuum extraction system is reduced and productivity is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An evaporation source material supplier inside an evaporation system, wherein the evaporation system includes an evaporation chamber and a vacuum extraction system, the source material supplier is on one of the sidewalls inside the evaporation chamber, the vacuum extraction system connects with the evaporation chamber, the evaporation chamber further includes a movable evaporation boat and a wafer holder, the movable evaporation boat is in the lower portion of the evaporation chamber and the wafer holder is in the upper portion of the evaporation chamber, comprising:

a revolving cassette wheel for holding evaporation source material; and a crucible directly underneath the revolving cassette wheel.

2. The supplier of claim 1, wherein the wafer holder is a device for gripping a wafer.

3. The supplier of claim 1, wherein the movable evaporation boat is a container that holds evaporation source material.

4. The supplier of claim 1, wherein the crucible is a container for temporarily holding the evaporation source material dropped from the revolving cassette wheel.

5. The supplier of claim 1, wherein the crucible is connected to an external direct current source.

6. The supplier of claim 5, wherein the direct current source can be turned on to heat up the crucible.

7. The supplier of claim 1, wherein the revolving cassette wheel further includes:

a revolving wheel;

a central axle located at the center of the revolving wheel that facilitates rotation of the entire wheel;

a plurality of separating plates evenly distributed around the perimeter of the revolving wheel; and a fixed outer casing enclosing the revolving wheel and the separating plates, wherein the separating plates and the outer casing together partitions the revolving wheel into a plurality of capsules, and the outer casing has a drop hole directly above the crucible.

8. The supplier of claim 7, wherein each of the capsules can hold a lump of evaporation source material.

9. An evaporation system, comprising:

an evaporation chamber;

a vacuum extraction system connected with the evaporation chamber;

a wafer holder in the upper portion inside the evaporation chamber;

a movable evaporation boat in the lower portion inside the evaporation chamber; and a source material supplier on one of the sidewalls inside the evaporation chamber for delivering evaporation source material into the movable evaporation boat, wherein the source material supplier further includes: a revolving cassette wheel holding evaporation source material; and a crucible directly underneath the revolving cassette wheel.

10. The evaporation system of claim 9, wherein the wafer holder is a device for gripping a wafer.

11. The evaporation system of claim 9, wherein the movable evaporation boat is a container for holding evaporation source material.

12. The evaporation system of claim 10, wherein the crucible is a container for temporarily holding the evaporation source material dropped from the revolving cassette wheel.

13. The evaporation system of claim 10, wherein the crucible is connected to an external direct current source.

14. The evaporation system of claim 13, wherein the direct current source can be turned on to heat up the crucible.

15. The evaporation system of claim 10, wherein the revolving cassette wheel further includes:
- a revolving wheel;
- a central axle located at the center of the revolving wheel that facilitates rotation of the entire wheel;
- a plurality of separating plates evenly distributed around the perimeter of the revolving wheel; and
- a fixed outer casing enclosing the revolving wheel and the separating plates, wherein the separating plates and the outer casing together partitions the revolving wheel into a plurality of capsules, and the outer casing has a drop hole directly above the crucible.

16. The evaporation system of claim 15, wherein each of the capsules can hold a lump of evaporation source material.

* * * * *